United States Patent
Platzgummer

(10) Patent No.: US 7,714,298 B2
(45) Date of Patent: May 11, 2010

(54) PATTERN DEFINITION DEVICE HAVING DISTINCT COUNTER-ELECTRODE ARRAY PLATE

(75) Inventor: Elmar Platzgummer, Vienna (AT)

(73) Assignee: IMS Nanofabrication AG, Vienna (AT)

( * ) Notice: Subject to any disclaimer, the term of this patent is extended or adjusted under 35 U.S.C. 154(b) by 171 days.

(21) Appl. No.: 12/120,130

(22) Filed: May 13, 2008

(65) Prior Publication Data
US 2008/0283767 A1 Nov. 20, 2008

(30) Foreign Application Priority Data
May 14, 2007 (AT) ................ A 744/2007

(51) Int. Cl.
*H01J 37/302* (2006.01)
(52) U.S. Cl. ............... 250/396 R; 250/492.22
(58) Field of Classification Search ............. 250/396 R, 250/492.22
See application file for complete search history.

(56) References Cited

U.S. PATENT DOCUMENTS

| | | | |
|---|---|---|---|
| 5,369,282 | A | 11/1994 | Arai et al. |
| 6,768,125 | B2 | 7/2004 | Platzgummer et al. |
| 7,084,411 | B2 | 8/2006 | Lammer-Pachlinger et al. |
| 7,276,714 | B2 * | 10/2007 | Platzgummer et al. . 250/492.22 |
| 2005/0242302 | A1 | 11/2005 | Platzgummer et al. |
| 2005/0242303 | A1 | 11/2005 | Platzgummer |

FOREIGN PATENT DOCUMENTS

| EP | 1033741 A2 | 9/2000 |
|---|---|---|
| JP | 2006332289 | 12/2006 |

OTHER PUBLICATIONS

Zhang et al., "Integrated Multi-Electron-Beam Blanker Array for Sub-10-nm Electron Beam Induced Deposition", J. Vac. Sci. Technol., Nov./Dec. 2006, vol. B24, No. 6, pp. 2857-2860.
European Search Report for European Application 08450077.6 dated Jan. 29, 2010; date of completion Jan. 22, 2010, 4 pgs.

* cited by examiner

*Primary Examiner*—Kiet T Nguyen
(74) *Attorney, Agent, or Firm*—Kauth, Pomeroy, Peck & Bailey LLP

(57) ABSTRACT

A multi-beam pattern definition device for use in a particle-beam processing or inspection apparatus, which is set up to be irradiated with a beam of electrically charged particles and allow passage of the beam through a plurality of apertures thus forming beamlets, which are imaged onto a target. A deflection array has a plurality of electrostatic deflector electrodes for each beamlet. Each deflector electrode can be applied an electrostatic potential individually. Counter electrodes are electrically connected to a counter potential independently of the deflection array through a counter-electrode array. The counter potentials may be a common ground potential or individual potentials in order to improve system reliability. In conjunction with an associated counter electrode, each deflector electrode deflects its beamlet sufficiently to deflect the beamlet off its nominal path when applied an activating voltage against the respective counter electrode.

20 Claims, 6 Drawing Sheets

PATTERN DEFINITION DEVICE HAVING DISTINCT COUNTER-ELECTRODE ARRAY PLATE

CROSS-REFERENCE To RELATED APPLICATIONS

This application claims the benefit of Austrian Patent Application Serial No. A 744/2007, filed May 14, 2007, the disclosure of which is hereby incorporated by reference as if set forth in full herein.

BACKGROUND

The invention generally relates to pattern definition systems and in particular to a multi-beam pattern definition device for use in a particle-beam processing or inspection apparatus, which is set up to be irradiated with a beam of electrically charged particles and allow passage of the beam through a plurality of apertures thus forming a corresponding number of beamlets, representing a patterned beam to be imaged onto a target. For this task, the pattern definition device comprises a deflection array means having a plurality of blanking openings located such that each of the beamlets traverses one of the blanking openings along a nominal path, and further comprising a plurality of electrostatic deflector electrodes, each of which is associated with a blanking opening and is individually provided with a connecting line for applying an electrostatic potential; in conjunction with an associated counter electrode, each deflector electrode is configured to deflect a beamlet traversing the respective blanking opening by an amount sufficient to deflect the beamlet off its nominal path when applied an activating voltage against the respective counter electrode.

In a particle-beam exposure apparatus employing this kind of pattern definition device, a particle beam is generated by an illumination system and illuminates a pattern definition means having an array of apertures which define a beam pattern to be projected on a target surface. One important application of a particle-beam exposure apparatus of this kind is in the field of nano-scale patterning, by direct ion beam material modification or by electron or ion beam induced etching and/or deposition, used for the fabrication or functionalization of nano-scale devices. Another important application is in the field of maskless particle-beam Lithography, used in semiconductor technology, as a Lithography apparatus wherein, in order to define a desired pattern on a substrate surface, a substrate, e.g., a silicon wafer or mask blank, is covered with a Layer of a radiation-sensitive resist. A desired structure is then exposed onto the photo-resist which is then developed, in the case of a positive resist by partial removal according to the pattern defined by the previous exposure step. The developed resist is used as a mask for further structuring processes such as reactive etching.

The U.S. Pat. No. 5,369,282 (Arai et al.) discloses an electron-beam exposure apparatus using a so called blanking aperture array (BAA) which plays the role of the pattern definition means. The BAA carries a number of rows of apertures, and the images of the apertures are scanned over the surface of the substrate in a controlled continuous motion whose direction is perpendicular to the aperture rows. The rows may be aligned with respect to each other in an interlacing manner so that the apertures form staggered Lines as seen along the scanning direction. Thus, the staggered Lines may sweep continuous Lines on the substrate surface without Leaving gaps between them as they move relative to the substrate, thus covering the total area of the substrate to be exposed. Certainly, if the beam array is scanned over the substrate in a way to fill up the interstitial regions, also a regular array of beams can be used.

An multi-electron beam source with a blanker array is presented by Zhang et al. in "Integrated multi-electron-beam blanker array for sub-10-nm electron beam induced deposition", J. Vac. Sci. Technol. B 24(6), pp. 2857-2860. That article also presents a discussion of the geometry of the blanking electrodes placed on a blanker array wafer and the associated electric field geometry.

The U.S. Pat. No. 6,768,125 and U.S. Pat. No. 7,084,411 by the applicant/assignee presents a multi-beam maskless lithography concept, dubbed PML2 (short for 'Projection Mask-Less Lithography #2'), that employs a pattern definition device (PD device) comprising a number of plates stacked on top of the other. U.S. Pat. No. 6,768,125 and U.S. Pat. No. 7,084,411 are hereby incorporated by reference as if set forth in full herein. The PD device comprises at least two different plates having comparably high integration density of apertures and deflectors, namely an aperture plate used to define beamlets permeating the PD device, and a deflector array plate used to individually blank out selected beamlets ('blanking plate'). Another function, absorbing the majority of heat load imposed by the incoming beam, may be provided by a specific 'cover plate' or included the aperture plate which is then placed as a first plate as seen along the direction of the beam. These separate plates are mounted together at defined distances, for instance in a casing.

The aperture plate comprises an array of apertures which define a beam pattern, consisting of beamlets, to be projected on a target surface. Corresponding blanking openings on the blanking plate are associated with said apertures. Said blanking openings are located such that each of the beamlets traverses the blanking opening that corresponds to the aperture defining the beamlet respectively. Each blanking opening is provided with a beamlet deflection means that can be controlled by a blanking signal between two deflection states, namely, a first state ('switched on') when the beamlet deflection means has assumed a state in which particles passing through the opening are allowed to travel along a desired path, and a second state ('switched off') when the beamlet deflection means is deflecting particles transmitted through the opening off said path.

The US Patent Publication No. 2005/0242302 A1 by the applicant/assignee proposes to form the electrodes around the blanking openings by perpendicular growth employing state-of-the-art electroplating techniques. US Patent Publication No. 2005/0242302 A1 is hereby incorporated by reference as if set in full herein. The beamlet deflection means associated with each aperture comprises a set of beamlet deflection electrodes, usually a pair. Each set has electrodes of different types: a first type are 'ground electrodes', which are applied a ground potential, whereas another type, which is called here the 'active electrodes', are applied individual potentials in order to switch on or off the respective apertures according to the desired pattern. The ground electrodes are formed so as to have a substantial height over the blanking plate and the active electrodes. This is done in order to provide a better shielding of the blanking deflection means against cross-talking and other unwanted effects such as lens effects incurred by the electrode geometry.

FIG. 12 shows a prior-art embodiment of a PD system 102 in conformance with the U.S. Pat. No. 6,768,125 and US 2005/0242302 A1. The PD system 102 comprises a number of plates 201, 202 which are mounted in a stacked configuration, realizing a composite device whose components serve respective functions. Each of the plates is preferably realized as a semiconductor (in particular silicon) wafer in which the structures have been formed by micro-structuring techniques known in the art. The plates 201, 202 are bonded together at bonding regions 212 in the frame by means of known bonding techniques.

Apertures are located in membranes mb formed by thinned regions of the wafers. Each aperture corresponds to a set of consecutive openings which are defined in said plates; in FIG. 12, two apertures are shown, to represent a large number of apertures forming the aperture field in the membranes mb. The lithography beam lb traverses the plates through this array of apertures.

The first plate in the direction of the incoming beam is an aperture plate 201 (short for 'aperture array plate'). It absorbs the majority of the impingent lithography beam lb, but the radiation can pass through a number of apertures of defined shape, thus forming a plurality of beamlets A, B; only two apertures and corresponding beamlets are shown in FIG. 12 and the subsequent figures for the sake of clarity. Apart from the task of forming the beamlets, the aperture plate 201 serves to protect the subsequent plate(s) from irradiation damage. For this purpose it may be coated with a resistive layer 210.

Following the aperture array plate 201 downstream, a deflector array plate 202 (DAP; also referred to as blanking array plate in view of their function in the context of the apparatus 100) is provided. This plate serves to switch off the passage of selected beamlets. The DAP has a plurality of openings, which each correspond to a respective aperture of the aperture array plate 201. Each opening is provided with a beamlet deflection means composed of electrodes 220, 221, 220', 221' and individually controlled to deflect, if required, particles radiated through the opening off their path.

In the prior-art DAP illustrated in FIG. 12, each beamlet deflection means comprises an active electrode 221, 221' and a ground electrode 220, 220' respectively. The electrodes are free-standing with respect to the DAP base membrane. The electrodes may be formed by perpendicular growth employing state of the art techniques.

For instance, beamlet A transgresses the subsequent openings of the pattern definition system 102 without being deflected, since the beamlet deflection means formed by the respective set of beamlet deflection electrodes is not energized, meaning here that no voltage is applied between the active electrode 221 and the associated electrode 220. This corresponds to the "switched-on" state of the aperture. Beamlet A passes the pattern definition system 102 unaffected and is focused by the particle-optical system through the crossovers and imaged onto the target. In contrast, as shown with beamlet B, a "switched-off" state is realized by energizing the beamlet deflection means of this aperture, i.e., applying a transverse voltage to the active electrode 221' with regard to the corresponding ground electrode. In this state, the beamlet deflection means formed by electrodes 220',221' deflects the beamlet B off its path. As a consequence the beamlet B will, on its way through the optical system, obey an altered path and be absorbed at an absorbing means provided in the optical system, rather than reaching the target. Thus, beamlet B is blanked. The beam deflection angle is largely exaggerated in FIG. 12; it is, in general, very small, typically 0.2 to 2 thousands of a radian.

The pattern of switched-on apertures is chosen according to the pattern to be exposed on the substrate 17, as these apertures are the only portions of the pattern definition device transparent to the beam lb, which is thus formed into a patterned beam pb emerging from the apparatus.

The PD device comprises generally at least two different plates for comparably high integration density of apertures and deflectors, namely, at least an aperture plate for forming the beamlets (and possibly absorbing the majority of heat load imposed by the incoming beam) and a deflector array plate for selected blanking of beamlets. Moreover, it is conceivable that by using sufficiently complex process flows a PD device could be fabricated also from one plate, e.g., a Silicon-On-Insulator (SOI) Wafer). Highly accurate alignment between the two or more plates and excellent alignment towards the direction of the incoming beam is required.

One approach for a highly integrated deflector array that can be operated as programmable DAP employs electroplated electrodes constructed above a CMOS plate as deflector array plates, as illustrated in FIG. 12. These electrodes are formed vertically with shielding electrodes to reduce cross talk of neighboring apertures. The disadvantage of the electroplating approach with shielding electrodes is related to the limited aspect ratio of the electroplating that can be produced by industrial methods at hand, which considerably limits the achievable integration level.

Another possible way to obtain a highly integrated deflector array operable as programmable DAP that is usable in setups like a PML2, is to produce one CMOS plate accommodating the required circuitry and another plate as a deflector array plate having the electrodes, and then to vertically interconnect the CMOS plate with the deflector array plate by bonding (e.g., eutectic bonding). In this case, for each aperture at least one electrical connection across the plates is required. The vertical interconnection has a major disadvantage connected with the yield problem with the enormous number (up to 1 million) of vertical bonds to be fabricated within a 30 µm×30 µm area space for one bonding, compounded by the fact that the membrane structures have a thickness smaller than 50 µm are highly fragile, rendering the interconnection a delicate process.

SUMMARY

The present invention provides among other things a way to simplify the task of providing the electric supply of the electrodes in a DAP and circumventing the problems described above in connection with providing the high degree of circuitry integration.

This aim is met by a PD device with a deflection array means as mentioned in the beginning, further comprising a counter-electrode array means which provides additional mechanical support of counter electrodes located at the deflection array means and/or an additional electrical connection of counter electrodes to a counter potential, wherein such electrical connection runs independently of the deflection array means. The independent electric connection on the counter electrode means does not exclude an additional electric connection on the deflection array means, which may be complementary.

The invention among other things also allows the avoidance of delicate vertical bonding and high aspect ratio electroplating. This is achieved by expelling (at least a major part of) the mechanical support and electrical connections of the counter electrodes from the DAP. Instead, the ground connections are moved to a different component of the PD means.

The invention in one embodiment uses one electroplated electrode on the CMOS wafer membrane with a multi-aperture array, and place another membrane with a second multi-aperture array, carrying the counter electrodes which have a uniform potential. This potential can be fed by one common interconnection and is conveniently ascribed 0 V (ground potential).

It is worthwhile to note that the term ground potential, when used in the context of the present invention, i.e., selected beamlet deflection, refers to a potential that is used as a common reference potential for the electrodes associated with the individual beamlet deflectors. This ground potential may be different from a ground potential of other electrical systems such as the optical columns of the irradiating and projecting systems or an earthing of the apparatus; there may even exist a defined voltage between the ground potential levels of the DAP and the optical columns.

In one embodiment of the invention, the counter electrodes are components of the counter electrode array means, so the counter electrodes are then contained in the counter electrodes electrically and physically.

To further simplify the contacting, the counter-electrode array means may provide electrical connection to a common counter potential, for example through an electrical conductive bulk of a membrane.

In an alternative approach of contacting, the counter-electrode array means may provide electrical connections of the counter electrodes to respective counter potentials. Individual counter potentials may be provided and even controlled individually. Furthermore, said counter potentials may have opposite polarity (as seen with respect to a common ground potential) to the potentials which are applicable to the deflector electrodes, respectively. Based on an individual application of the electric potentials to the electrodes, the deflector electrodes and the associated counter electrodes, respectively, forming bi-polar deflectors. In order to improve the stability of the device against potential failure, the electric potentials provided to the deflector electrodes and counter electrodes may suitably chosen to be sufficiently high so they can deflect a beamlet traversing the respective blanking opening off its nominal path even in the case that only one of the associated deflector and counter electrode is applied the respective electric potential.

The counter-electrode array means may be realized as a generally plate-shaped component having a plurality of openings allowing passage of the beamlets. The counter-electrode array means may then be the final component of the pattern definition device and comprise a conductive plane configured to terminate electrical fields produced within the pattern definition device against the space after it, as seen along the direction of the particle beam. The conductive plane may simply be the bulk of the plate-shaped component or any other part base of the counter-electrode array means. It may, however, be realized as a conductive layer separated from the bulk by an Insulating layer. The conductive plane may further be realized as a conductive layer sectioned into a composite electrode comprising a number of partial electrodes according to a partitioning of an area covered by the conductive layer into non-overlapping sub-areas, said partial electrodes being contacted individually for applying different electrostatic potentials.

In one arrangement of the PD device according to the invention, the deflector electrodes and at least a part of the associated counter electrodes are arranged so as to take opposite positions lateral to the respective beamlet. It is further advantageous if each deflector electrode and at least a part of the associated counter electrodes is located along the path of the respective beamlet.

In one suitable aspect of the invention, the counter-electrode array means is simultaneously the aperture array means. In this case, the apertures for forming the beamlets are realized as openings in the counter-electrode array means, the width of said apertures being smaller than the width of the corresponding blanking openings.

As an alternative which is equally suitable, an aperture array means may be provided which comprises the apertures for forming the beamlets and is independent of the counter-electrode array means, the width of said apertures being smaller that the width of the corresponding blanking openings.

In a further development of the invention, in addition to first counter electrodes realized as components of the counter-electrode array means, second counter electrodes may be present as components of the deflection array means, wherein the first and second counter electrodes combine to form composite counter electrodes acting as opposite electrodes of said deflector electrodes. This measure brings about a Longer range of the electric field resulting in an extended duration of interaction with the beamlet particles, which allows to obtain a higher effectivity of the beamlet deflection (lower deflection voltages required). The second counter electrodes may be connected electrically through the counter-electrode array means or, preferably, on the deflection array means. The first and second counter electrodes are preferably shaped so as to be generally congruent.

Furthermore, the counter electrodes located on the counter electrode means may be advantageously shaped so as to introduce additional fortifications running along the counter electrode means, so as to reduce cross-talk between neighboring beamlets and/or improve the thermal conductivity of the counter electrode means as a whole, in particular in the case that the counter electrode means represents the first plate of the PD device.

BRIEF DESCRIPTION OF THE DRAWINGS

In the following, the present invention is described in more detail with reference to the drawings, which show.

DETAILED DESCRIPTION

The embodiments of the invention discussed in the following are related to a PML2-type particle-beam exposure apparatus with a pattern definition system as disclosed in the U.S. Pat. No. 6,768,125 (=GB 2,389,454 A) of the applicant/assignee, and with a large-reduction projecting system. In the following, first the technical background of the apparatus is discussed as far as relevant to the invention, and then embodiments of the invention are discussed in detail. It should be appreciated that the invention is neither restricted to the following embodiments nor to a pattern definition system, which merely represents one of the possible implementations of the invention.

Figure 1:
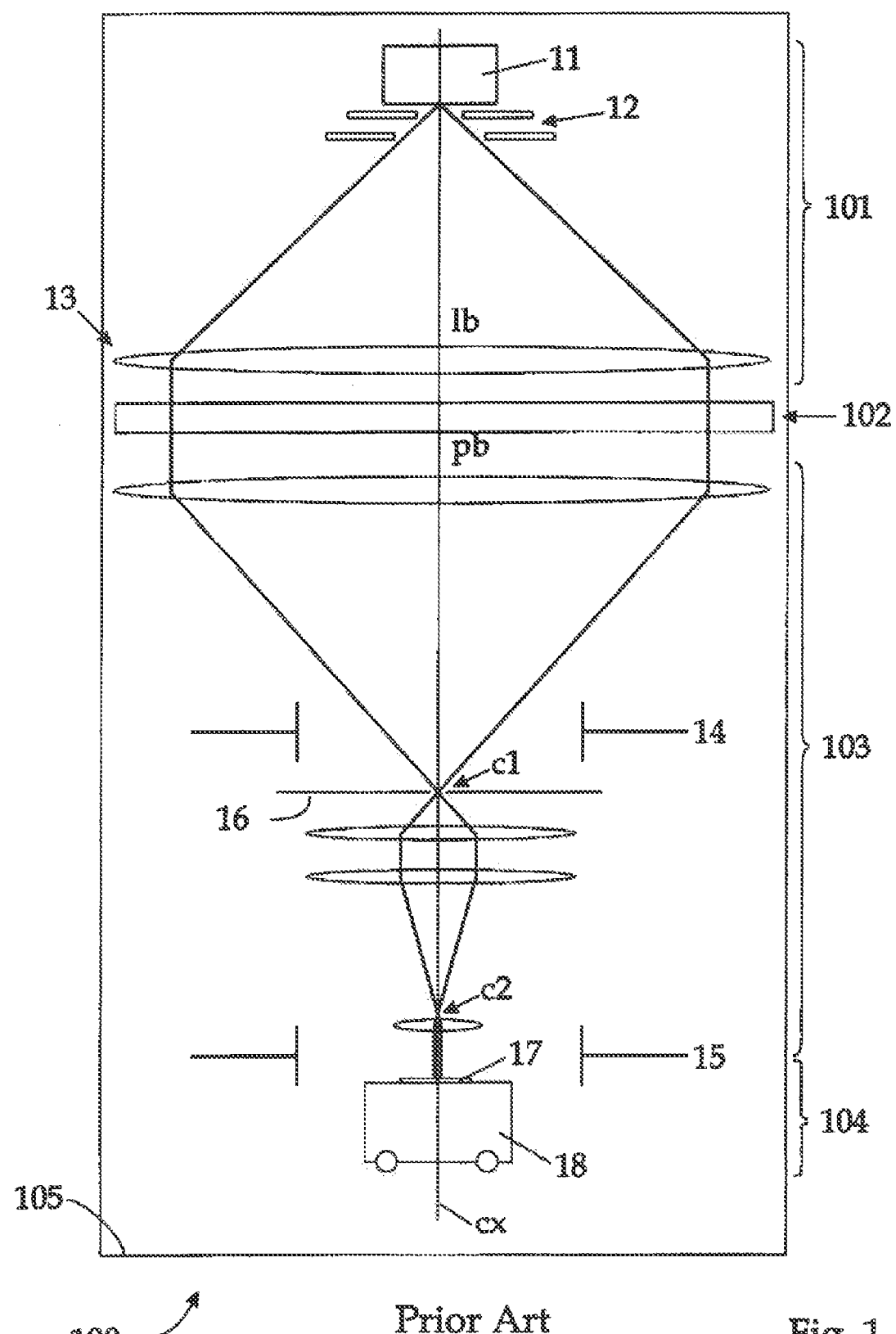
FIG. 1 a longitudinal section of a schematic layout of a particle beam exposure apparatus to which the invention applies.

FIG. 1 shows an overview of a lithographic apparatus in which the embodiments of the invention discussed below can be realized. For the sake of clarity, the components are not shown to size. The main components of the lithography apparatus 100 are—corresponding to the direction of the lithography beam lb, pb whose downstream direction runs vertically downward in FIG. 1—an illumination system 101, a pattern definition system 102, a projecting system 103 and a target station 104 with a substrate 17 on a wafer stage 18. The present invention relates to the pattern definition system 102. Nevertheless, the lithographic apparatus is described first to give an example for a possible application of the invention.

The whole apparatus 100 is contained in a vacuum housing 105 held at high vacuum to ensure an unimpeded propagation of the beam lb, pb along the optical axis cx of the apparatus. In the embodiment shown, the particle-optical systems 101, 103 are largely realized using electrostatic lenses; it should be noted that other implementations such as electromagnetic lenses may be used as well.

The illumination system 101 comprises an electron or ion source 11 fed by a gas supply (not shown) and an extraction system 12. In one preferred embodiment, helium ions ($He^+$) are used. It should, however, be noted that in general other electrically charged particles can be used as well. Apart from electrons these can be, for instance, hydrogen ions or heavy ions; in the context of this disclosure heavy ions refer to ions of elements heavier than C, such as O, N, or the noble gases Ne, Ar, Kr, Xe. It is also possible to use negatively charged ions such as negative hydrogen ions or carbon fullerene ions.

The ion source 11 emits energetic particles, i.e., having a defined (kinetic) energy of typically several keV, e.g., 10 keV. By means of an electro-optical condenser lens system 13, the particles emitted from the source 11 are formed into a wide, substantially telecentric particle beam serving as lithography beam lb. The lithography beam lb then irradiates the pattern definition system 102, described in more detail below. The lithography beam lb irradiates a plurality of apertures in the pattern definition system 102. Some of the apertures are "switched on" or "open" so as to be transparent to the incident beam; the other apertures are "switched off" or "closed", i.e., non-transparent to the beam, meaning that the beamlet does not reach the target. The pattern of switched-on apertures is chosen according to the pattern to be exposed on the substrate 17, as these apertures are the only portions of the pattern definition device transparent to the beam lb, which is thus formed into a patterned beam pb, consisting of a plurality of beamlets.

The pattern as represented by the patterned beam pb is then projected by means of a charged particle projection system 103 onto the substrate 17 where it forms an image of the switched-on apertures of the pattern definition system 102. The projection system 103 implements a demagnification of, for instance, 200 times with two crossovers c1, c2. If a beamlet is deflected off its switched-on path by the pattern definition system 102, it is absorbed in a stop plate 16, which is, for instance, located at a position surrounding one of the crossovers, for instance the first crossover c1; but a position at or near to the second crossover c2 may be preferred as well.

The substrate 17 may be a silicon wafer covered with a resist layer which is sensitive to the particle beamlets. The wafer is held and positioned by a wafer stage 18 of the target station 104. Correction of image position and distortion can be done by means of multipole electrodes 14 and 15.

Figure 2:
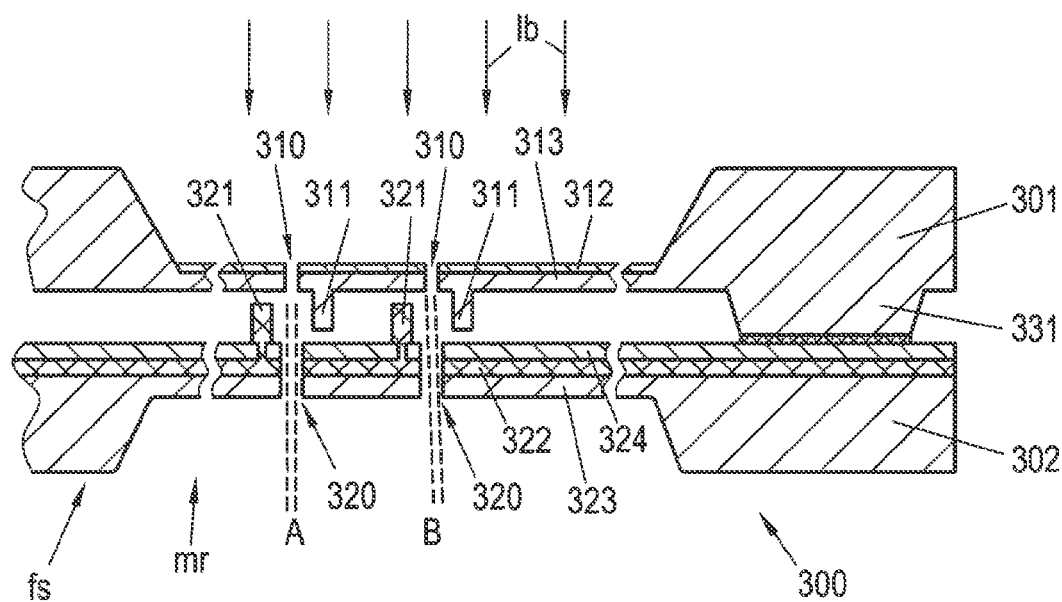
FIG. 2 a two-plate PD system according to a first embodiment of the invention in a longitudinal sectional view.

FIG. 2 illustrates the PD system 300 according to a first embodiment of the invention. FIG. 2 (and likewise FIGS. 4 to 9) is a schematic longitudinal section, i.e., along a section plane parallel to the optical axis cx.

The PD device 300 comprises to plates 301, 302, which are mounted in a stacked configuration, realizing a composite device whose components serve respective functions. A first plate 301 combines the functions of an aperture plate as discussed in the introductory part of this disclosure and a counter-electrode plate as explained below. A second plate 302 serves as DAP. The plates 301, 302 include membrane regions mr supported by surrounding frames fs having a thickness considerably greater than the membranes, respectively. The membranes are arranged in a manner ensuring a small distance between them. The distance between the membranes mr exceeds the height of the beamlet deflecting electrodes 311, 321 by only a small amount as needed to ensure electric insulation with regard to the neighboring membrane surface. This ensures that the electric field between corresponding beamlet deflecting electrodes is substantially confined to the space they surround.

Figure 3:
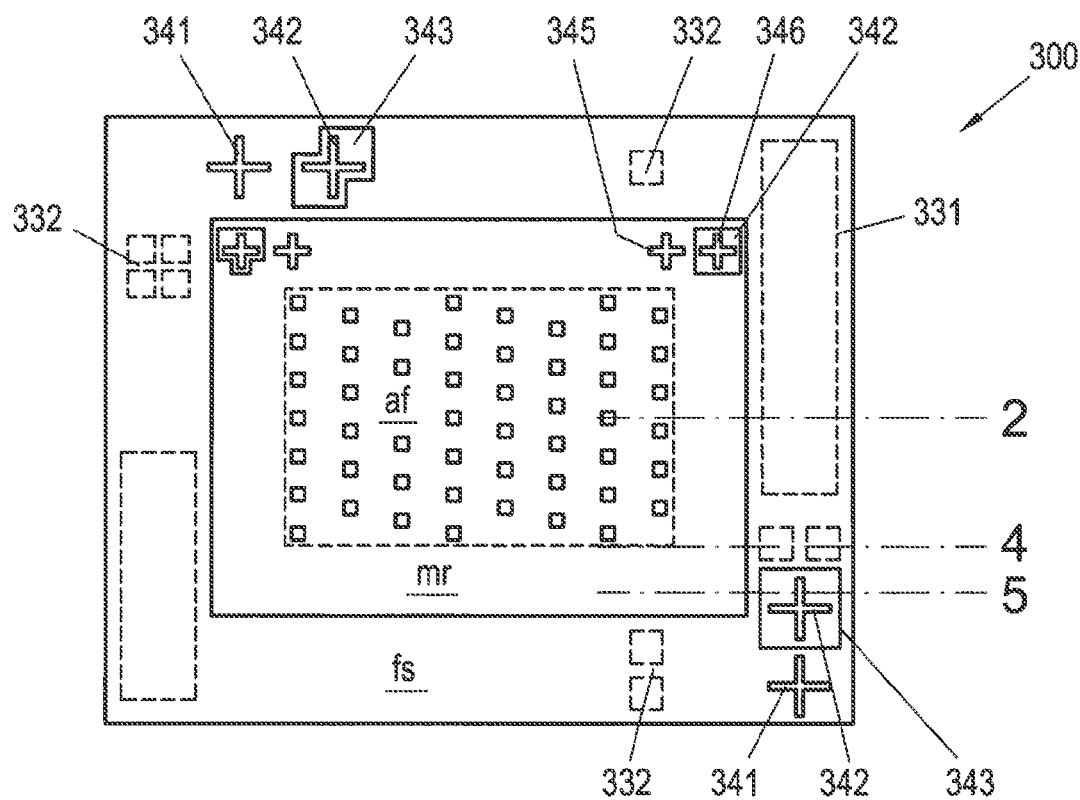
FIG. 3 a plan view of the PD system of FIG. 2.

Each of the plates 301, 302 is realized as a semiconductor (in particular silicon) wafer in which the structures have been formed by micro-structuring techniques known in the art. As with the prior art, the lithography beam lb traverses the plates through an array of apertures. Each aperture corresponds to a set of consecutive openings which are defined in said plates. Only two apertures and corresponding beamlets are shown in FIG. 3 and the subsequent figures for the sake of clarity.

The membrane of the first plate 301 comprises an aperture field having a plurality of apertures 310 through which the radiation of the impingent lithography beam lb passes, thus forming a plurality of beamlets. By the same token the plate 301 protects the subsequent plate 302 from irradiation damage. For this purpose it may suitably be coated with a radiation-resistant layer 312.

Figure 12:
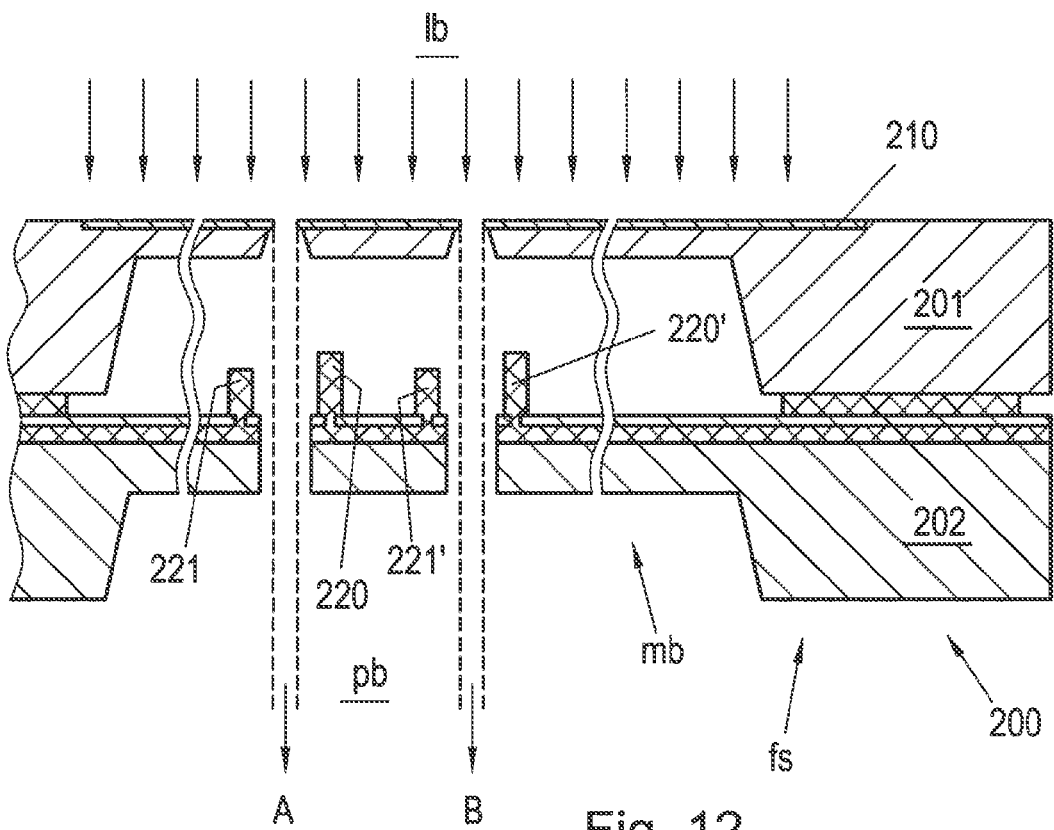
FIG. 12 a longitudinal sectional detail of a pattern definition system according to the prior art.

The DAP 302 serves to switch off the passage of selected beamlets. The DAP has a plurality of openings 320 and associated deflection electrodes 321. Each opening 320 corresponds to a respective aperture 310 of the aperture array plate 301, and is provided with a respective beamlet deflection electrodes serving as active electrodes 321 of a respective beamlet deflection means. The active electrodes 321 cooperate with counter electrodes 311 which are at a uniform ground potential and are, according to a preferred implementation of the invention, realized as components of the first plate 301 protruding or extending from the membrane towards the second plate 302. Thus, the set of electrodes that form the beamlet deflection means associated with an aperture or corresponding beamlet is located on different plates 301, 302 of the PD system. As before with FIG. 12, the beam deflection angle is largely exaggerated for the beamlet emerging from a "switched-off" aperture in FIG. 2 (and likewise in FIGS. 6 to 8).

The active electrodes 321 are controlled individually by means of control feed lines and associated circuitry located in a circuitry layer realized by a CMOS layer 322. The CMOS layer is formed on the membrane bulk 323; furthermore, it may suitably be realized as a buried layer beneath a covering layer 324 made of semiconductor or oxide. For the sake of clarity, the internal structure of the CMOS layer 322 is not shown but symbolized by cross-hatching.

The counter electrodes 311 and the membrane material 313 electrically connecting them, both being components of the first plate 301, are preferably made of a material with sufficient electric conductivity so as to ensure a sufficiently constant potential even while the varying potentials at the individual active electrodes 321 of the DAP 302 are applied.

The plates 301, 302 are bonded together in order to fix their relative position. To that end, elevated regions, of which one is shown in FIG. 2 as 331, are provided in one (or both) plates 301, 302 within the region of the frame fs. The plates are bonded together in the areas of the elevated regions 331 using known bonding techniques such as Sn on Cu.

A typical value of the width of the apertures 310 is, for instance, 3.5 μm; the width of the openings 320 in the DAP is somewhat wider, e.g., 5.5 μm; and the mutual distance of the electrodes 311, 321 across the aperture is about 7 μm. The distance of the membranes of the plates 301, 302 is, for instance about 40 μm.

FIG. 3 illustrates a plan view of the PD device 300 as seen along the direction of the beam, i.e., from the side of the illumination system. The membrane region mr of the PD device 300 is held within the supporting frame fs, and comprises a plurality of apertures arranged in a regular pattern according to a staggered arrangement, thus forming an aperture array in an aperture field af. The shapes of the membrane region mr and of the aperture field af are usually quadratic or rectangular; but other shapes are possible, as well, depending on the specific application. From the preceding discussion of the PD device in relation to FIG. 2, it will be clear that most features visible in FIG. 3 belong to the first plate 301, which covers almost all of the DAP 302, when viewed along the optical axis as is the case here. FIG. 2 represents a longitudinal section along the line 2 in FIG. 3. Further sectional views along lines 4 and 5 in FIG. 3 and pertaining features relate to FIGS. 4 and 5, respectively.

Shown with dashed lines in FIG. 3 are features covered by the surface of the first plate 301. Covered features are, most notably, the elevated regions 331 used for bonding the plate wafers, as well as mounting structures 332 which are used during the mounting and bonding procedure in order to ensure that the plates are assembled at a minimum distance to each other so as to avoid collision of the electrodes 311, 321 and membranes. Furthermore, the structures 332 may also provide for a primary guide for lateral positioning, so that the assembly arrives at a relative lateral position of the plates to each other with only small variance which is then easy to adjust by means of alignment inspection as explained further below.

Typical further parameters for a programmable DAP as used in a PML2 architecture are: Aperture field size 16.128 mm×24.997 mm; cell size 6*3.5 μm×6*3.5 μm, i.e., offset between apertures within one line 36*3.5=126 μm; number of apertures 128×7142=914176; suitable height of active deflector electrodes 35 μm, with active electrodes controlled and energized by CMOS IC; height of ground electrodes 50 μm.

Figure 4:
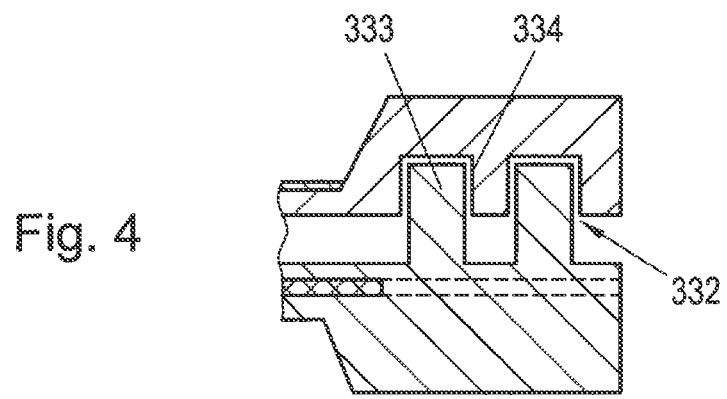
FIG. 4 mounting guide structures in the PD system of FIG. 2 in another longitudinal sectional view.

FIG. 4 shows an example of the mounting guide structures 332 in a longitudinal sectional view along plane 4 of FIG. 3. Column-like structures 333 are formed on one of the internal surfaces of the plates 301, 302 and engage in corresponding hole-like features or recesses 334 formed in the opposite internal surface. The column structure 333 preferably has a height such that it enters several tens of μm into the recess 334. The lateral width of the recess is a little wider that the diameter of the column in order to ensure that the latter can be introduced taking into account production tolerances. For instance, the diameter of the column structure may be 30 to 50 μm, and the recess width may have additional 10 μm. The column structure may be formed on either of the plates 301, 302 by any suitable method, such as perpendicular growth, or by etching them out of the bulk material.

Referring again to FIG. 3, alignment structures 341, 342, 345, 346 are provided in the frame fs, but may also be formed in the membrane mr outside the aperture field af. While some of the alignment structures 341, 345 are present on the first plate 301, the alignment structures 342, 346 are formed in the DAP 302 and are visible through respective windows 343, 347 provided in the first plate. The alignment structures 342, 346 of the DAP.(as well as any further plate, if present, covered by the first plate) of special interest since they allow fine positioning of the DAP 302 after it has been mounted with the covering plate 301.

Figure 5:
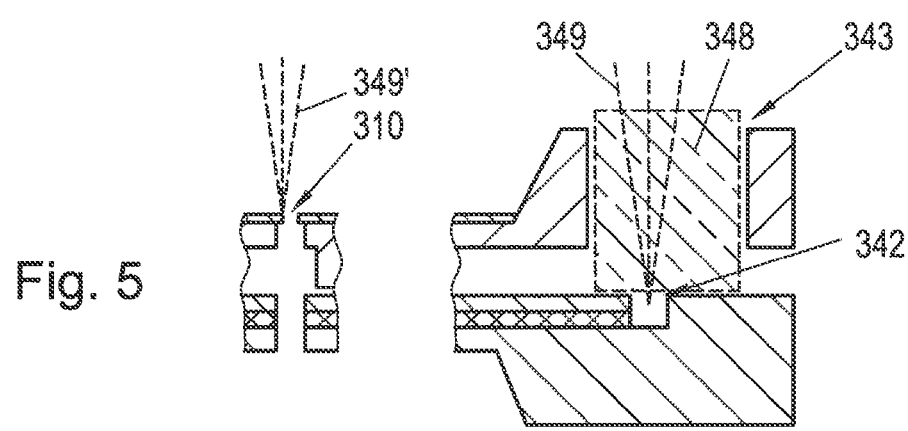
FIG. 5 alignment structures in the PD system of FIG. 2 in yet another longitudinal sectional view.

Also referring to FIG. 5, which shows detail views according to a longitudinal section along plane 5 shown in FIG. 3, the alignment inspection is done with regard to the visible structures of the plates, in particular the alignment structures as well as, possibly, the apertures 310 in the covering plate. The structures serve as optical markers which can be inspected using an optical microscope. They may be, for instance parallel or crossed lines etched in the surface of the plate; the width of the lines is typically several μm, for instance 5 μm. In FIG. 5, the optical path of an inspection system is depicted symbolically as dashed lines 349, 349'. In order to adjust the optical length of the inspection system with regard to the longitudinal position of the features of the cover plate, such as an aperture 310, a glass block 348 can be inserted to compensate for the different height of the features 342 on the DAP 302.

One mounting procedure includes the following steps: First, the cover plate and DAP are constructed, and the regions for bonding are applied the bonding material, such as Sn on Cu, epoxy resin or other suitable material as known in the art. Both plates are inserted in a mounting setup with an XY-adjusting system as well-known in the art. The cover plate is set on the prepared DAP and moved laterally until the mounting guide structures engage. Using the inspection structures, the relative position is adjusted as required, using the actuators of the adjusting system, so as to converge the plates until the bonding material locks the relative position of the plates permanently. Then the finished PD device can be taken from the mounting setup and subjected to optical and electrical inspection.

Figure 6:
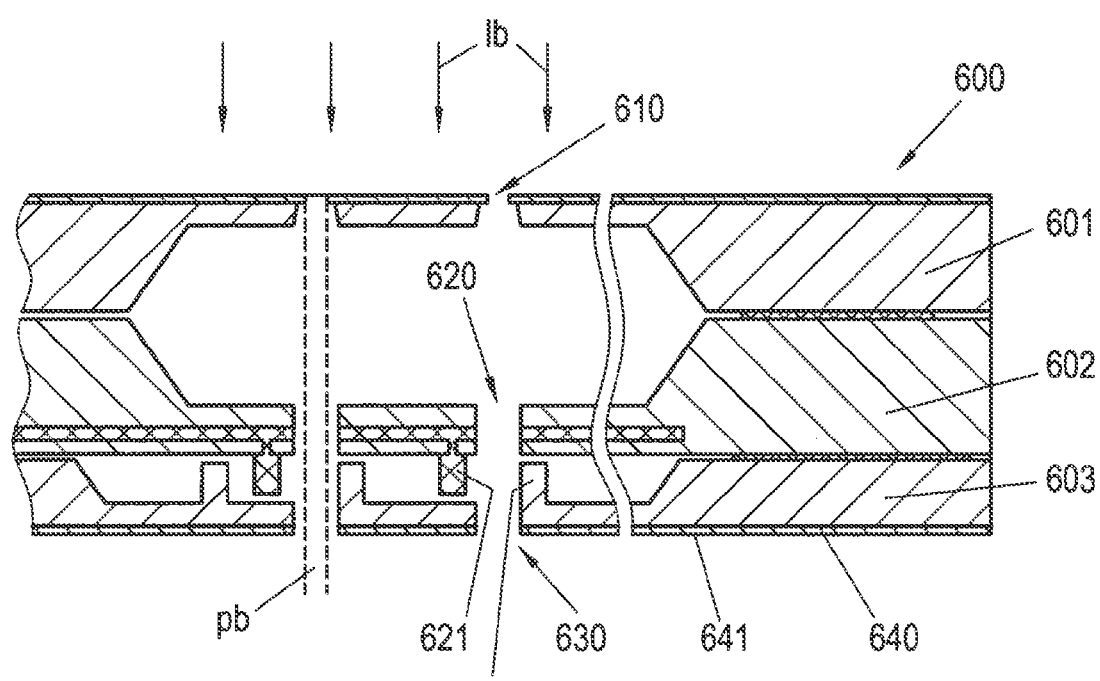
FIG. 6 a three-plate PD system according to a second embodiment of the invention.

In other embodiments according to the invention the plate realizing the counter electrode may be realized separate from the aperture plate or cover plate proper. A three-plate PD device 600 is illustrated in FIG. 6 in a longitudinal section. An aperture plate 601 is the first plate as seen along the direction of the beam. The apertures 610 in the aperture plate 601 define the beamlets transgressing the further plates and forming the patterned beam lb as also known from the prior art. A DAP 602 comprises corresponding openings 620 and a plurality of beamlet deflecting electrodes acting as active electrodes 621, which here are provided on the downstream side of the plate. The active electrodes 621 cooperate with ground electrodes 631 provided on a third plate, the counter-electrode array plate. The electrodes are arranged on both the DAP and the counter-electrode array plate such that each aperture (each beamlet) is associated with a set of electrodes forming a beamlet deflection means to switch on or off the respective beamlet, namely by proper individual control of the electric potential applied to the active electrode 621 while the electric potential of the ground electrode is maintained at uniform ground potential.

The width of the openings 630 in the counter-electrode array plate is sufficiently greater than the width of the apertures 610; for example, with a typical width of the apertures of 3.5 µm, the width of the openings 630 may suitably be about the double value, i.e., about 7 to 8 µm.

In the embodiment shown in FIG. 6, the counter-electrode array plate is the final plate of the PD device. It has the additional function as a field boundary plate, which effectively confines the electrical fields of the PD device, so the space after the PD device (which is the space below the plate 603 in FIG. 6) has a well-defined field configuration for the operation of the projection system 103.

Figure 7:
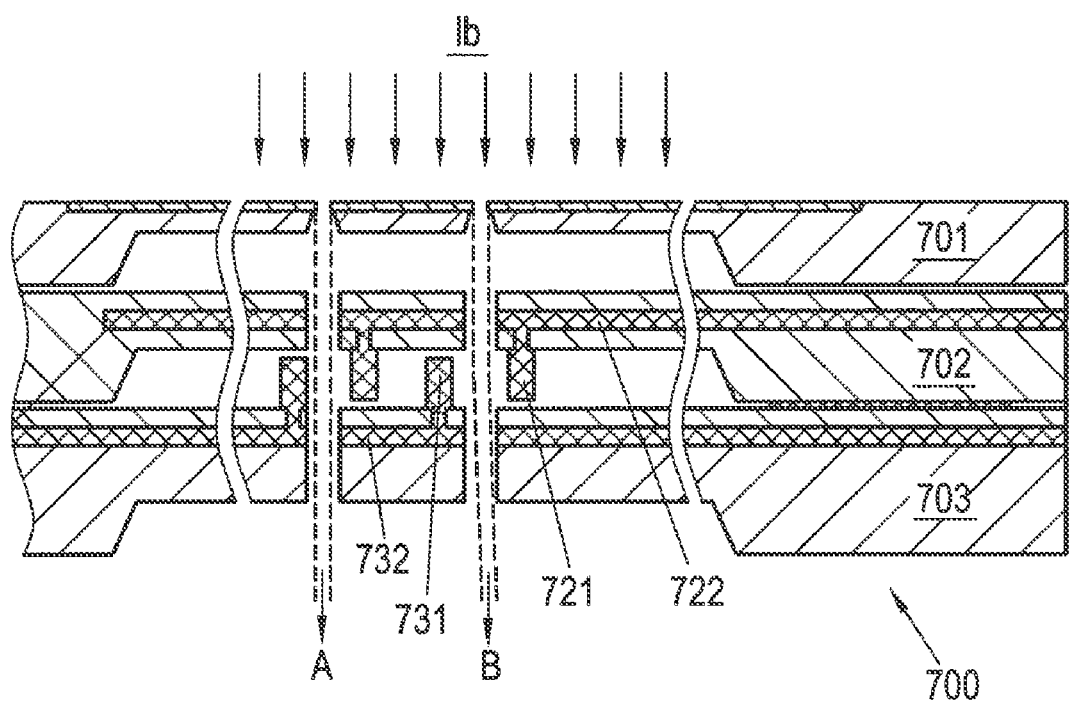
FIG. 7 a two-plate PD system according to a third embodiment of the invention.

FIG. 7 illustrates the PD system 700 according to a third embodiment of the invention in a schematic longitudinal section. The PD device of FIG. 7 comprises three plates which are mounted in a stacked configuration, realizing a composite device whose components serve respective functions. A first plate 701 serves as aperture plate as discussed above; a second plate 702 is a first DAP with active electrodes 721 having a given polarity; and a third plate 703 is a second DAP with active electrodes 731 having the respectively opposite polarity to the electrodes of the second plate 702. Thus, the second DAP serves as counter electrode array plate for the first DAP, or vice versa. The electric control and supply of the electrodes 721, 731 is provided for by respective CMOS layers 722, 732 in both DAPs. The electrodes in either DAP may be controllable independently from those of the other DAP, respectively.

The use of a setup with two DAPs of opposite polarity has the advantage that a bi-polar deflector can be realized. The corresponding CMOS structures, in this case fabricated in different plates separately, can be operated with only one voltage per CMOS. The production of bi-polar CMOS technology in one plate would be very difficult complex and expensive, and therefore not feasible by means of state-of-the-art semiconductor technology at the given frequency and space requirements. A bi-polar deflector has the great advantage that, primarily due to the compensation of the net charges on the electrodes, stray fields are very small and that aberrations due to the deflector fields are largely reduced as compared to a mono-polar deflector. If the voltage of the bi-polar deflectors is chosen such that only one electrode needs to be energized in order to deflect the beam sufficiently much (e.g., the same voltage as in case of FIG. 2), then full functionality is maintained even in the case that one of the deflector signals fails but the other one is operating. This will reduce the error rate due to potential defect electrodes or bit errors.

Control of beamlet deflection is done through both electrodes that are associated with a beamlet, but in a variant where each beamlet is deflected by applying a deflecting voltage through applying to either of the electrodes is also possible.

Referring again to FIG. 6, if a particular electrical potential is desired at the location immediately after the final plate serving as field boundary plate, that plate can include a conducting layer 641 to which that potential is applied. The layer 641 may suitable be separated from the bulk of the plate 603 by an insulating layer 640. Moreover, the layer 641 may be sectioned into a composite electrode according to a partitioning of the area of the membrane region mr or any other suitable region on the downstream surface of the plate into non-overlapping sub-areas, and these partial electrodes may be contacted individually so as to apply different electrostatic potentials to them. The layer 641, in particular the partial electrodes, are preferably made of electrically conductive material such as metal. However, any material can be chosen which gives rise to a well-defined electrostatic boundary if placed in an electrostatic environment with presence of electrostatic fields. One alternative to electrically conductive material could be a semi-conducting material with sufficient doping. The layer 641 can, for instance, be used to realize a plate electrode in order to form a divergent lens in conjunction with tube electrodes (annular electrodes) positioned downstream of the PD device.

Figure 8:
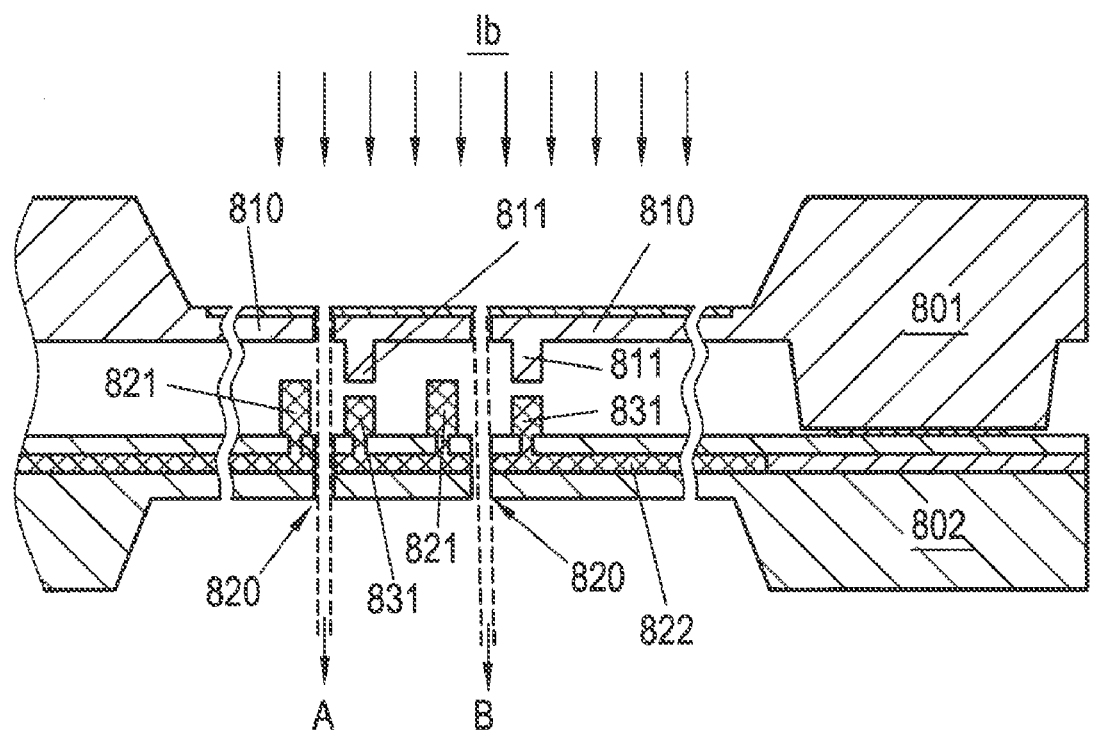
FIG. 8 two-plate PD system according to a fourth embodiment of the invention.

Yet another embodiment of the invention is shown in FIG. 8, which shows a PD device having two plates 801, 802 (like the first embodiment, cf. FIGS. 2 and 3). The PD device of in FIG. 8 is based on the embodiment of FIG. 2 above in which the counter electrode plate is used as beam forming aperture plate at the same time, and has the same configuration where not stated otherwise below. Still, it will be clear that its special features can be combined with any other embodiment of the present invention.

The first plate 801 functions as aperture plate having first counter electrodes 811 as described above, with the first counter electrodes protruding from the membrane 810 of the aperture plate toward the second plate. The second plate 802 is a DAP in which the openings 820 are provided with active electrodes 821 much like discussed above. In variation to the above embodiments of the invention, the openings of the DAP are also provided with second counter electrodes 831. The second counter electrodes 831 are applied ground potentials from the CMOS layer 822 or via a separate ground line (not shown).

The first and second counter electrodes 811, 831 are preferably located so as to have the same or at least largely overlapping position if viewed in a plan view (i.e., with a view direction parallel to the irradiating beam). The distance between the facing tips of corresponding electrodes 811, 831 can be low since the electric potentials is ideally zero; in practice, small variations of the potential will have to be allowed to take account of unavoidable residual line resistance and inductivity effects.

The electrodes 821, 831 belonging to an opening are electrically configured in a manner that in the switched-on state of the opening, the electrodes 821, 831 are shortcut through a closed switch such as a CMOS transistor. This ensures that the electrodes have the same electric potential in the switched-on state. The potential is a ground potential or a potential varying from ground potential by only a small voltage due to mentioned residual line resistance and inductivity effects.

In a variant, the electrodes 811, 831 may even touch so as to form an electric connection between the second counter electrodes 831 on the DAP 803 and the ground potential formed by the plate 801. In one case, an electrical supply to the counter electrodes 831 from the circuitry of the DAP 802 is not necessary, and the counter electrodes 831 may by isolated from the rest of the DAP. In another case, the composite counter electrode is fed through the CMOS layer and held at the 0 V potential of the CMOS layer; this will ensure a reduction of stray electric fields in the inactivated state (cf. FIG. 9*b* as discussed below) to a minimum.

By virtue of the configuration illustrated in FIG. 8, each of the active electrodes 821 is cooperating with an associated composite counter electrode which is formed by a respective first and second counter electrode 811, 831. This measure brings about a longer interaction range between the particles of the beam and the electric field spanning between the active electrode 821 and the composite counter electrode, resulting in an extended duration of interaction, which allows to obtain a higher effectivity of the beamlet deflection and, in turn, lower deflection voltages.

The configuration employing composite counter electrodes is more robust with respect to ground bouncing effects. The term ground bouncing describes the local shift of ground potential due to current flow and limited conductivity of metal layers, which may be up to 10% (sometimes even more) of the operating voltage, depending on the specific design, clock frequency and power dissipation of the CMOS structure during operation. This helps to avoid possible problems which may arise in the case that the ground potential of the DAP (the CMOS circuitry) and the potential of the counter electrode deviate by more than a given acceptable voltage value. That acceptable voltage corresponds to the acceptable beam deflection of the switched-on aperture state, in which there should be no deflection of the beamlet off its path. The acceptable beam deflection angle in the switched-on state will typically be much smaller than the numerical aperture (=local divergence) of the illuminating beam, and will be a few percent of the typical deflection voltage which is applied to "switch off" a beam. It is important to note that the PD device, and particularly the DAP, is located in, or close to, the object plane of the projection optics, so small beam deflections in the "switched-on" state do not give rise to any change (in first order imaging) of the landing position on the substrate.

Figure 9A:
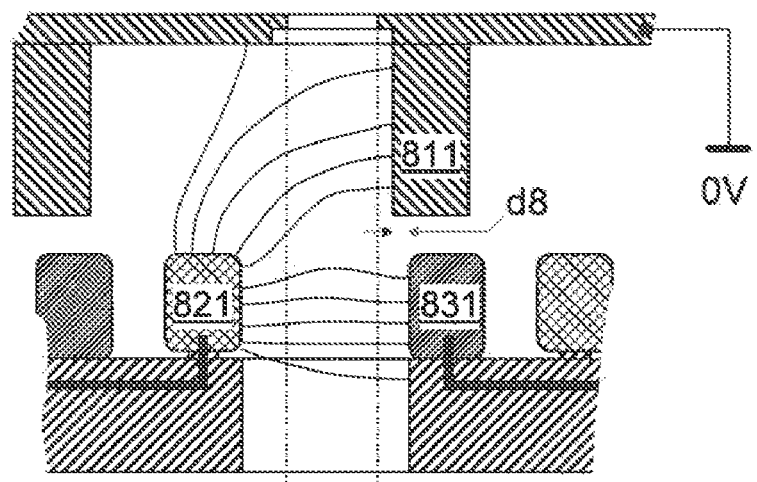
FIG. 9a illustrates the electric field between the active and the counter electrodes in the activated state (beamlet switched-off)
Figure 9B:
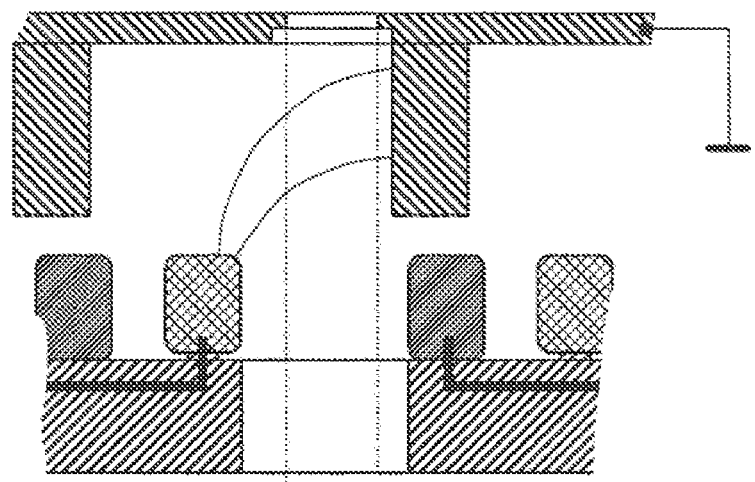
FIG. 9b illustrates the electric field between the active and the counter electrodes in the inactive state (beamlet switched-on)

The composite ground electrode configuration overcomes the mentioned problem. As can be seen in FIG. 9a, the electric field serving as a deflection field of the DAP extends between the electrodes 821, 831 positioned on the DAP and the additional counter electrode 811 positioned on the counter electrode plate. Consequently, the deflection effect results from the combination of the pair of electrodes 821, 831 and the electrode 811. FIG. 9b displays the field configuration in the switched-on state (i.e., inactive state in which the electrodes 821, 831 are at the same potential). Shown is a case in which the CMOS ground potential differs (at least locally) from the potential counter electrode device voltage, which may for instance be due to ground bouncing. The height of the electrodes, in particular that of the counter electrode 831, is chosen such that a beam deflection in the switched-off state, which may arise owing to a residual voltage caused by ground bouncing, is sufficiently small. The difference of the potentials between the electrodes 811, 821 in the non-active state (switched-on beamlet) should be not greater than 3 to 15% of the active voltage (switched-off beamlet). The electrostatic field lines are shown in FIGS. 9a and 9b only in those regions where the particle beam is effected.

Figure 9C:
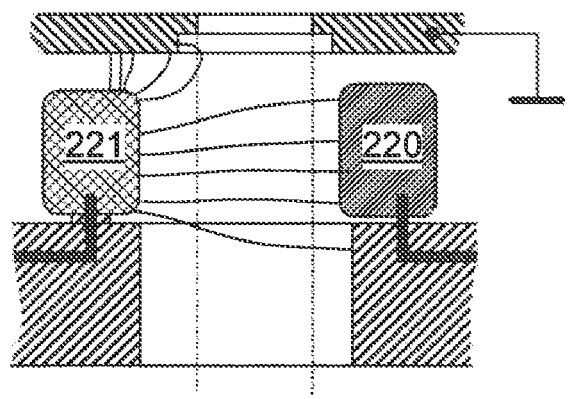
FIG. 9c illustrates the electric field of a state-of-the-art configuration.

The primary effect of the first counter electrode 811 is that it enhances the deflective effect of the electrostatic fields in the boundary regions. Those boundary-region electrostatic fields would be suppressed in an arrangement where the aperture plate is positioned close above the DAP electrodes as in the prior art, as illustrated in the example of FIG. 9c, in which the aperture plate solely has the function of a shielding plate to prevent cross talk between neighboring deflecting electrodes. In contrast, as can be seen from FIG. 9a, using the same blanking electrode dimensions in conjunction with a counter electrode on the opposing plate will not only enhance the deflection power significantly (by 10-50%, depending on the aspect ratio of the pair of electrodes positioned on the DAP) but also avoid cross talk.

The electrodes 821, 831 on the DAP may be produced by structuring employing CMOS-compatible electroplating or deposition processes with relatively low aspect ratio. The counter electrode 811 may be formed by a structuring process with a high aspect ratio such as a well-known silicon technology process. The electrodes 821, 831 on DAP can be of equal height, which will typically be 0.5 to 2 times the distance of the electrodes; in this case, for instance, 8 µm distance between the electrodes, 4 µm height. The height of the counter electrode 811 can be considerably larger, for instance 20 µm (measured from the surface facing towards the DAP).

The shape of the first counter electrodes 811 in the plate plane can be designed to be quite similar to that of the second ground electrodes 831. Still, since the lithographic definition with respect to the beam-forming opening can be done more precisely on the plate 801, the vertical wall of the counter electrode facing towards the CMOS deflector electrode may protrude by a small spatial difference d8 as compared with the second ground electrode, which will, for safety and tolerance reasons, be designed to be at a distance to the beam path.

Figure 10:
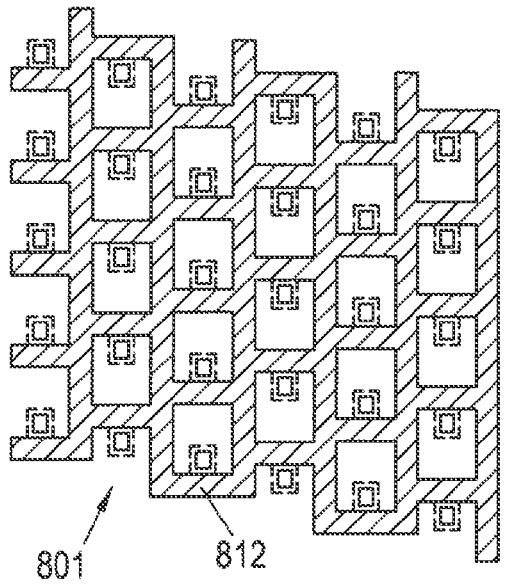
FIG. 10 shows a layout of the electrodes of the aperture array plate.
Figure 11:
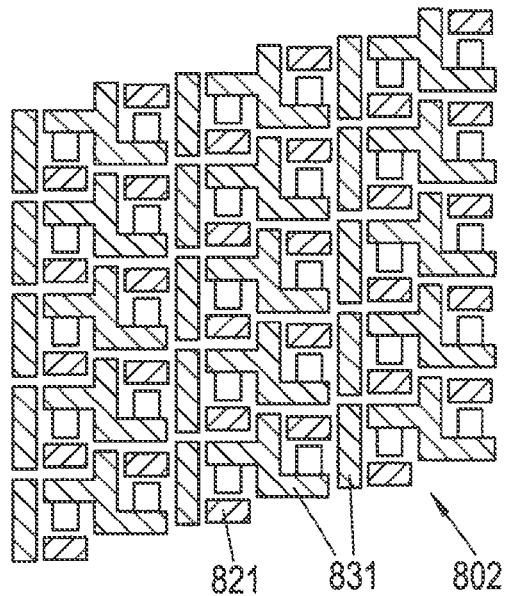
FIG. 11 shows a layout of the electrodes of the deflector array plate corresponding to that of FIG. 10.

The counter electrodes 811, 831, in particular the first counter electrodes 811, are formed in such a way that no cross talk is possible between neighboring blanker cells. FIGS. 10 and 11 show plan view details on the plates 801 and 802, respectively, showing a an area covering several apertures. The shown layout employs alternating deflecting directions across the apertures. Shown are the opposing sides of the plates 801, 802, which is why the arrangement of electrodes 811, 831 are mirrored. It is clear that once the plates are connected (which is equivalent to folding FIGS. 10 and 11 against each other) the electrode shapes are congruent, if the small deviation d8 along the direction of the electric field is neglected.

FIG. 10 shows the electrode layout of the aperture plate 801. The counter electrodes may be separate, but may also merge into each other as shown. The latter is suitable in particular in the case that the counter electrodes are formed from the membrane material, for instance by etching out the recesses surrounding the apertures.

FIG. 11 shows a plan view along the beam direction on the DAP 802. The second counter electrodes 831 may be merged for a small number of apertures (here two apertures) as shown, but the electrodes are separated from each other in order to prevent overall stress in the membrane structure.

As one additional benefit of the layout shown in FIG. 10, the counter electrodes 811 substantially increase the overall thermal conductivity of the aperture plate, which absorbs a majority of the illuminating beam and thus will have to dissipate a considerable thermal load. The electrodes 811 have the shape of a grid which mechanically supports the aperture plate and increases the thermal conductivity by factors of magnitude. This allows fabricating the beam-forming membrane of the aperture plate as thin as possible, typically 2 to 10 µm.

The invention is not limited to the embodiments discussed here. Rather, the number of plates in the PD device can vary; furthermore, the sequence of the plates, in particular of the blanking plate (or DAP), counter electrode plate and, if present as a separate plate, aperture plate, may be chosen different from the embodiments discussed above. Also, the footprint (base shape as seen in a plan view) of the respective electrodes may be arbitrary, in particular "U" or "L" shaped, in order to improve mechanical stability and/or electrical performance, or to facilitate the mounting process. Moreover, the shape of the blanking opening and the opening in the counter-electrode array plate need not be equal to each other's shape or the shape of the apertures which define the beamlet shapes. It is also possible within the invention that the mentioned openings accommodate more than one beamlets. In addition, it is worthwhile to note that in general, while each active electrode is associated with a counter electrode with which it cooperates, the counter electrodes may be realized such that they cooperate with one or more active electrodes.

Generally, the invention is meant to encompass any embodiment which the person skilled in the art will recognize as falling within the scope of the claims, in particular the independent claim(s), but including any combination of dependent claims referring directly or indirectly to the same base claim unless such combination would be infeasible.

I claim:

1. A multi-beam pattern definition device for use in a particle-beam processing or inspection apparatus, said device being adapted to be irradiated with a beam of electrically charged particles and allow passage of the beam through a plurality of apertures thus forming a corresponding number of beamlets, said device comprising
a deflection array having a plurality of blanking openings located such that each of the beamlets traverses one of the blanking openings along a nominal path, the deflection array comprising a plurality of electrostatic deflector electrodes, each of which is associated with a blanking opening and is individually provided with a connecting line for applying an electrostatic potential and is, in conjunction with an associated counter electrode, configured to deflect a beamlet traversing the respective blanking opening by an amount sufficient to deflect the beamlet off its nominal path when applied an activating voltage against the respective counter electrode, and
a counter-electrode array providing electrical connection of counter electrodes to a counter potential independently of the deflection array.

2. The device of claim 1 wherein the counter electrodes are components of the counter electrode array.

3. The device of claim 1 wherein the counter-electrode array includes an electrical connection to a common counter potential.

4. The device of claim 1 wherein the counter-electrode array includes electrical connections of the counter electrodes to respective counter potentials.

5. The device of claim 4 wherein said counter potentials have opposite polarity to the potentials which are applicable to the deflector electrodes, respectively.

6. The device of claim 5 wherein the deflector electrodes and the associated counter electrodes, respectively, forming bi-polar deflectors.

7. The device of claim 4 wherein the electric potentials provided to the deflector electrodes and counter electrodes are chosen sufficiently to deflect a beamlet traversing the respective blanking opening off its nominal path even in the case that only one of the associated deflector and counter electrode is applied the respective electric potential.

8. The device of claim 1 wherein the counter-electrode array is a generally plate-shaped component having a plurality of openings allowing passage of the beamlets.

9. The device of claim 8 wherein the counter-electrode array is the final component of the pattern definition device and comprises a conductive plane configured to terminate electrical fields produced within the pattern definition device against the space after it, as seen along the direction of the particle beam.

10. The device of claim 9 wherein the conductive plane is a conductive layer separated from a base of the counter-electrode array by an insulating layer.

11. The device of claim 9 wherein the conductive plane is a conductive layer sectioned into a composite electrode comprising a number of partial electrodes according to a partitioning of an area covered by the conductive layer into non-overlapping sub-areas, said partial electrodes being contacted individually for applying different electrostatic potentials.

12. The device of claim 1 wherein the deflector electrodes and at least a part of the associated counter electrodes are arranged so as to take opposite positions lateral to the respective beamlets.

13. The device of claim 1 wherein each deflector electrode and at least a part of the associated counter electrodes is located along the path of the respective beamlet.

14. The device of claim 1 wherein the apertures for forming the beamlets are realized as openings in the counter-electrode array, the width of said apertures being smaller than the width of the corresponding blanking openings.

15. The device of claim 1 further comprising an aperture array comprising the apertures for forming the beamlets and being independent of the counter-electrode array, the width of said apertures being smaller than the width of the corresponding blanking openings.

16. The device of claim 1 wherein in addition to first counter electrodes being components of the counter-electrode array, second counter electrodes are components of the deflection array means, wherein the first and second counter electrodes combine to form composite counter electrodes acting as opposite electrodes of said deflector electrodes.

17. The device of claim 16 wherein the second counter electrodes are electrically connected on the deflection array.

18. The device of claim 16 wherein the first and second counter electrodes are shaped so as to be generally congruent.

19. The device of claim 1 wherein the counter electrodes forming components of the counter electrode have one of a shape reducing cross-talk between neighboring beamlets and increased the thermal conductivity of the counter electrode as a whole.

20. The device of claim 1 wherein the counter-electrode array includes at least one of a mechanical support of counter electrodes located at the deflection array and an electrical connection of counter electrodes to a counter potential independently of the deflection array.

* * * * *